United States Patent
Su

[11] Patent Number: 5,837,582
[45] Date of Patent: Nov. 17, 1998

[54] METHOD TO INCREASE CAPACITANCE OF A DRAM CELL

[75] Inventor: Chung-Hui Su, Hsin-chu, Taiwan

[73] Assignee: Taiwan Semiconductor Manufacturing Company, Ltd., Hsin-Chu, Taiwan

[21] Appl. No.: 83,418

[22] Filed: May 22, 1998

[51] Int. Cl.⁶ .................................. H01L 21/8242
[52] U.S. Cl. ............................. 438/255; 438/398
[58] Field of Search .................... 438/250–256, 438/293–298

[56] References Cited

U.S. PATENT DOCUMENTS 5,385,863  1/1995  Tatsumi et al. ..................... 437/109
5,583,070  12/1996  Liao et al. .
5,618,747  4/1997  Lou .
5,639,685  6/1997  Zahurak et al. .................... 437/60
5,656,531  8/1997  Thakur et al. ..................... 438/398
5,691,228  11/1997  Ping et al. .......................... 437/60

*Primary Examiner*—Jey Tsai
*Attorney, Agent, or Firm*—George O. Saile; Stephen B. Ackerman

[57] ABSTRACT

A process for forming an HSG silicon layer, to be used as a component of, as well as to increase the surface area of, a polysilicon storage node electrode, has been developed. The process features initially depositing a polysilicon composite, comprised of underlying, undoped polysilicon layer, and an overlying, doped polysilicon silicon layer, resulting in an initial degree of surface roughness. The process continues with the deposition of an amorphous silicon layer, and an in situ anneal procedure, resulting in the conversion of the amorphous silicon layer, to a HSG silicon layer. The storage node electrode is then formed, comprised of the roughened HSG silicon layer, overlying the polysilicon composite.

18 Claims, 3 Drawing Sheets

METHOD TO INCREASE CAPACITANCE OF A DRAM CELL

Related Patent Activity, "A PROCESS TO FABRICATE HEMISPHERICAL GRAIN POLYSILICON", by C. H. Su, M. S. Liang, of Taiwan Semiconductor Manufacturing Corp., invention disclosure Ser. No. 08/858,108, assigned to a common assignee.

BACKGROUND OF THE INVENTION (1) Field of the Invention

The present invention relates to semiconductor fabrication processes used to fabricate dynamic random access memory, (DRAM), devices, on a semiconductor substrate, and more specifically to a process used to increase the surface area of capacitor storage node structure, via the use of hemispherical grain polysilicon.

(2) Description of Prior Art

The ability to fabricate silicon, exhibiting hemispherical grains, has found several applications in semiconductor chips. However the primary application for hemispherical grain, (HSG), silicon, has been its use in dynamic random access memory, (DRAM), devices. DRAM devices, using a stacked capacitor structure, (STC), is capacitance limited, by the dimensions of the capacitor. The STC structure, overlying a transfer gate transistor, is limited in area by the dimension of the underlying transistor structure. Therefore to obtain greater capacitance for DRAM devices, comprised with an STC structure, the semiconductor industry has attempted to increase the surface area of the storage node, or lower electrode, of the STC structure, without increasing the underlying transfer gate transistor area. This has been accomplished via use of a lower electrode, comprised of a roughened silicon surface, comprised of numerous concave and convex features, therefore supplying a greater surface area than counterparts, fabricated with smooth surfaces. One method for obtaining roughened silicon surfaces, has been the use of HSG silicon. HSG silicon surfaces are characterized by the concave and convex features, thus resulting in the desired surface area increase. The magnitude of the surface area increase, and thus the increase in STC capacitance, is a function of the degree of roughness of the HSG silicon.

The present invention will describe a process for producing HSG silicon, using a specific, and unique, three step deposition procedure, followed by an in situ anneal procedure. The three step deposition procedure is comprised of: a first deposition of an undoped polysilicon layer; an in situ second deposition, of a doped polysilicon layer; a third deposition, of an amorphous silicon layer; and an in situ anneal converting the amorphous silicon layer to the desired HSG silicon layer. This combination of deposition layers and anneal procedure, results in the surface roughness desired for DRAM storage node structures. Prior art, such as Thakur, et al, in U.S. Pat. No. 5,656,531, and Zahurak, et al, in U.S. Pat. No. 5,639,685, describe combinations of deposited polysilicon layers, and anneal procedures, used to create HSG silicon layers, however none of these prior arts use the combination of the three in situ depositions, and the in situ anneal, described in this invention.

SUMMARY OF THE INVENTION

It is an object of this invention to increase the surface area of a storage node electrode, used as part of a DRAM, stacked capacitor, (STC), structure, for a DRAM cell, via use of a storage node electrode structure comprised with a top layer of HSG silicon.

It is another object of this invention to deposit a series of layers, to be used for the storage node electrode shape, comprised of an undoped polysilicon layer, an in situ doped polysilicon layer, and an amorphous silicon layer.

It is yet another object of this invention to perform an anneal, in situ, in the same furnace used to deposit the amorphous silicon layer, converting the amorphous silicon layer to a HSG silicon layer.

In accordance with the present invention a process for forming a hemispherical grain, (HSG), silicon layer, to be used as a top layer for, and to be used to increase the surface area of, a storage node electrode, of a DRAM capacitor structure, has been developed. A transfer gate transistor, comprised of a polysilicon, or polycide, (metal silicide on polysilicon), gate structure, on a gate insulator layer, with a source/drain region, located in a region of a semiconductor substrate, not covered by the polysilicon gate structure, is provided. A storage node contact hole is opened in an insulator layer, exposing the top surface of a source/drain region of the transfer gate transistor. After formation of a polysilicon plug structure, in the storage node contact hole, a low pressure chemical vapor deposition furnace is used for the depositions of: an undoped polysilicon layer; an in situ doped polysilicon layer; and an undoped amorphous silicon layer. An anneal is next performed, in situ, in the LPCVD furnace, converting the amorphous silicon layer to an HSG silicon layer, overlying the doped polysilicon layer. Patterning of the HSG silicon layer, of the doped polysilicon layer, and of the undoped polysilicon layer, is next addressed creating the storage node electrode structure, contacting the polysilicon plug structure, in the storage node contact hole, and with a portion of the storage node electrode structure overlying the top surface of the insulator layer. A capacitor dielectric layer is then formed on the HSG silicon layer, followed by the creation of a polysilicon upper electrode structure, completing the process used to create the DRAM stacked capacitor structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming an HSG silicon layer, used to increase the surface area of storage node electrode structure, and used as part of a DRAM device, will now be described in detail. This invention will be described using an N channel, transfer gate transistor, however this invention can be applied to DRAM devices, comprised of P channel devices. In addition this invention is illustrated using a non-crowned, storage node structure, however the process for obtaining the HSG silicon layer described in this invention, can also be applied to a crown shaped, storage node electrode structure.

Figure 1:
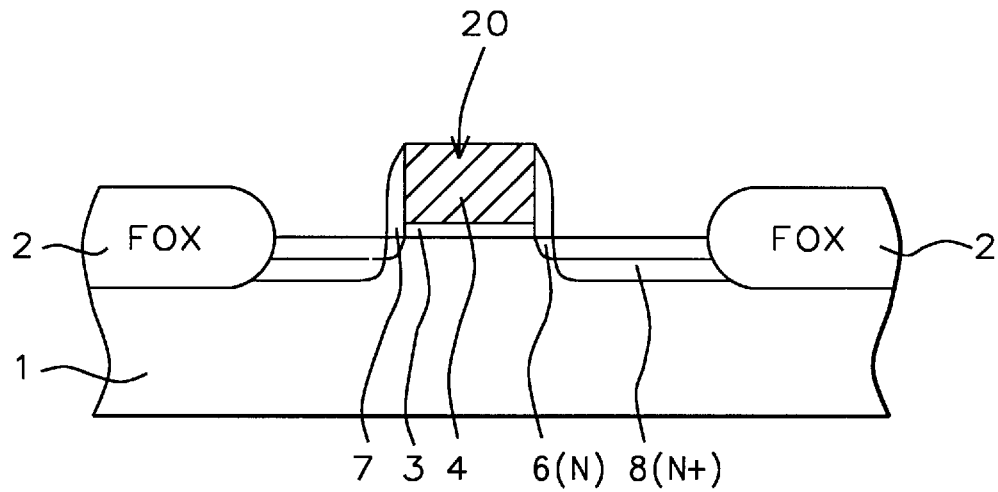
FIGS. 1–6, which schematically, in cross-sectional style, show the creation of a DRAM capacitor structure, featuring a storage node electrode structure, comprised with a top layer of HGS silicon.

FIG. 1, schematically shows the creation of a transfer gate transistor. A semiconductor substrate 1, comprised of P type, single crystalline silicon, having a <100>, crystallographic orientation, is used. Field oxide, (FOX), regions 2, are used for isolation purposes. FOX regions 2, are formed to a thickness between about 3000 to 5000 Angstroms, via thermal oxidation of exposed regions of semiconductor substrate 1. A patterned oxidation resistant, composite insulator mask, comprised of silicon nitride on silicon oxide, is used to protect subsequent device regions from the thermal oxidation procedure. At the completion of the FOX region formation, the patterned oxidation resistant, composite insulator mask is removed via the use of wet acid solutions, exposing the subsequent device region. After a series of wet cleans, including a buffered hydrofluoric acid procedure, a gate insulator layer 3, comprised of silicon dioxide, is grown using thermal oxidation procedures, to a thickness between about 50 to 200 Angstroms. A polysilicon layer 4, is next deposited using an low pressure chemical vapor deposition, (LPCVD), procedure, to a thickness between about 1500 to 4000 Angstroms. The polysilicon layer can be grown using in situ doping procedures, or grown intrinsically and doped via ion implantation procedures. A polycide, (metal silicide—polysilicon) layer, can be used in place of polysilicon layer 4, if desired. The polycide layer, comprised of a metal silicide layer, such as tungsten silicide, or titanium silicide, is more conductive than polysilicon counterparts.

Conventional photolithographic and reactive ion etching, (RIE), procedures, using $Cl_2$ as an etchant for polysilicon, or polycide layer 4, are used to create gate structure 20, shown schematically in FIG. 1. After removal of the photoresist shape that was used for patterning of gate structure 20, lightly doped source/drain region 6, is formed via an ion implantation procedure, using arsenic or phosphorous ions, at an energy between 20 to 50 KeV, a dose between about 1E13 to 5E13 atoms/$cm^2$. Next insulator spacers 7, are created on the sides of gate structure 20. Insulator spacers 7, are created by initially depositing a layer of silicon oxide, using LPCVD or PECVD procedures, to a thickness between about 1000 to 3000 Angstroms, followed by an anisotropic RIE procedure, using $CHF_3$ as an etchant. Insulator spacers 7, can also be silicon nitride, formed via deposition of a silicon nitride layer, directly followed by an anisotropic RIE procedure, using $SF_6$ as an etchant. Heavily doped, N type source/drain region 8, is than formed via ion implantation of either arsenic or phosphorous, at an energy between about 30 to 80 KeV, at a dose between about 1E14 to 1E15 atoms/$cm^2$. The result of these process steps are schematically shown in FIG. 1.

Figure 2:
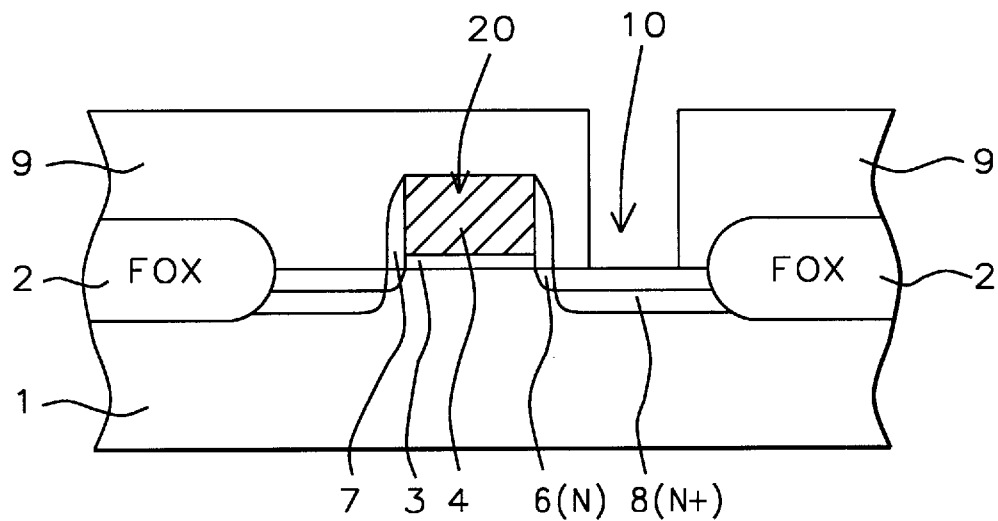

An insulator 9, comprised of silicon oxide, is obtained via LPCVD or PECVD procedures, at a thickness between about 6000 to 10000 Angstroms. Insulator layer 9, can also be a boro-phosphosilicate, (BPSG), layer, deposited again via LPCVD or PECVD procedures. Insulator layer 9, is next subjected to a chemical mechanical polishing procedure, resulting in a smooth top surface topography, for insulator layer 9, schematically shown in FIG. 2. Photolithographic and RIE procedures, using $CHF_3$ as an etchant, are next employed to open storage node contact hole 10, in insulator layer 9. Storage node contact hole 10, shown schematically in FIG. 2, is formed with a diameter between about 0.3 to 0.5 micrometer. The photoresist shape, used as a mask for the creation of storage node contact hole 10, is removed via plasma oxygen ashing and careful wet cleans.

Figure 3:
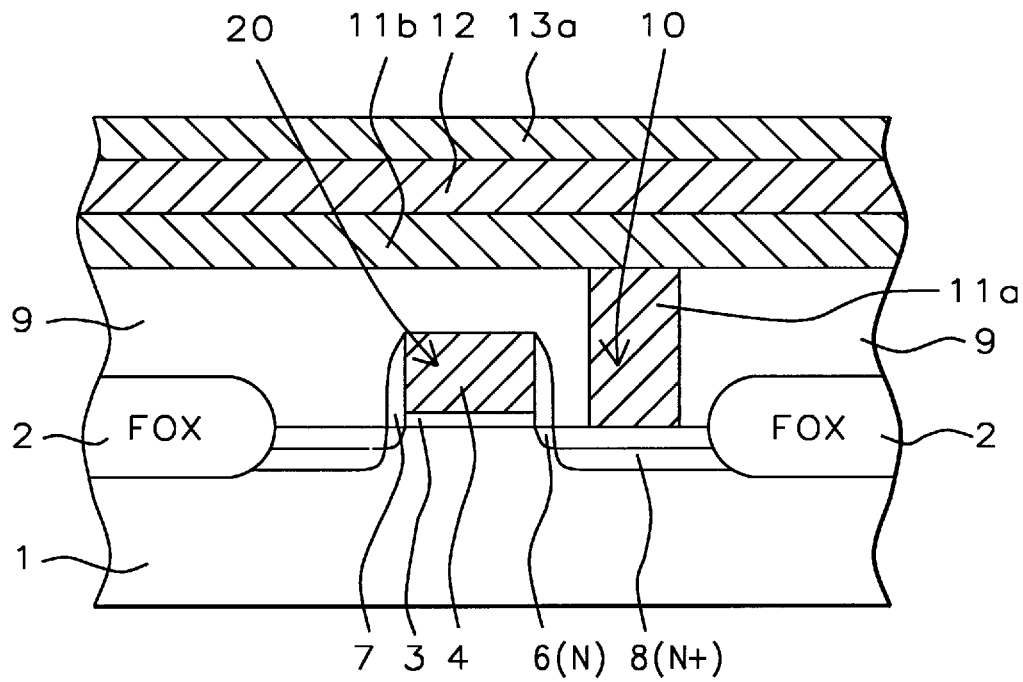

A polysilicon layer is next deposited, using LPCVD procedures, doped in situ during deposition via the addition of arsine, or phosphine, to a silane ambient, and completely filling storage node contact hole 10. An anisotropic RIE procedure, using $Cl_2$ as an etchant, is next employed to remove polysilicon from the top surface of insulator layer 9, creating polysilicon plug structure 11a, schematically shown in FIG. 1. Next an undoped polysilicon layer 11b, is deposited, via LPCVD procedures, at a temperature between about 560° to 600° C., to a thickness between about 300 to 500 Angstroms, overlying insulator layer 9, and overlying and contacting polysilicon plug structure 11a, residing in storage node contact hole 10. Next a doped polysilicon layer 12, is deposited, in situ, in the same LPCVD furnace previously used for deposition of polysilicon layer 11b. Polysilicon layer 12, is deposited at a temperature between about 560° to 600° C., to a thickness between about 300 to 500 Angstroms, and is in situ doped, during the LPCVD procedure, via the incorporation of arsine, or phosphine, to a silane ambient. The combination of the underlying undoped polysilicon layer 11b, and the overlying, doped polysilicon layer 12, schematically shown in FIG. 3, results in a greater level of surface roughness, than counterpart polysilicon layers, formed without the use of the undoped—doped combination. Finally an undoped, amorphous silicon layer 13a, schematically shown in FIG. 3, is also deposited, in the LPCVD furnace, at a temperature between about 490° to 550° C., to a thickness between about 600 to 1500 Angstroms.

Figure 4:
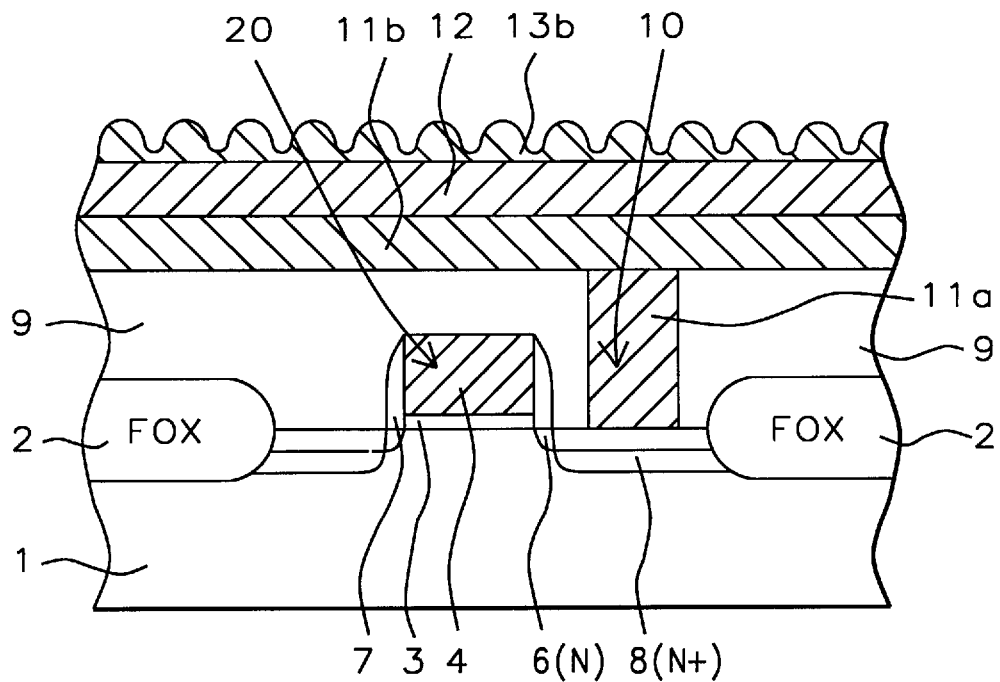

The procedure for converting amorphous silicon layer 13a, to HSG silicon layer 13b, is next addressed. An anneal cycle, performed in situ, in the same LPCVD furnace that was previously used for deposition of the amorphous silicon layer, is performed at a temperature between about 600° to 650° C., at a pressure between about 0.5 to 1.5 mtorr, and for a time between about 25 to 35 minutes. The anneal procedure, performed at a temperature greater than the temperature used for deposition of amorphous silicon layer 13a, results in the conversion of amorphous silicon layer 13a, to HSG silicon layer 13b, schematically shown in FIG. 4. The concave and convex features of HSG silicon layer 13b, is maximized by creation of this layer on the underlying composite polysilicon layer, comprised of doped polysilicon layer 12, on undoped polysilicon layer 11b.

Figure 5:
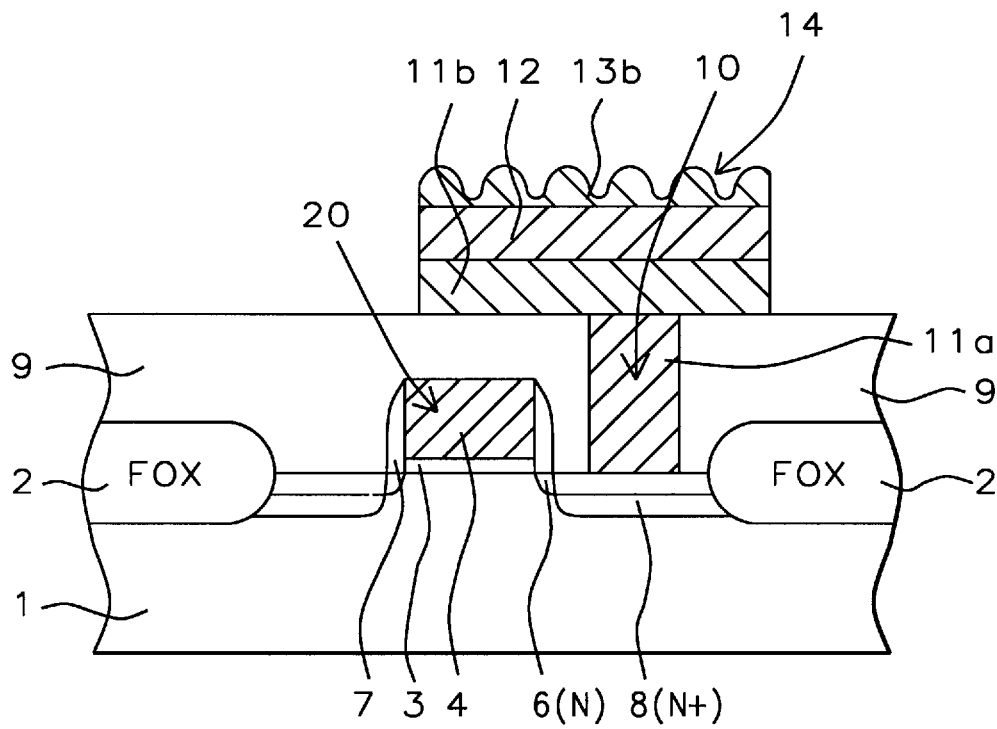
Figure 6:
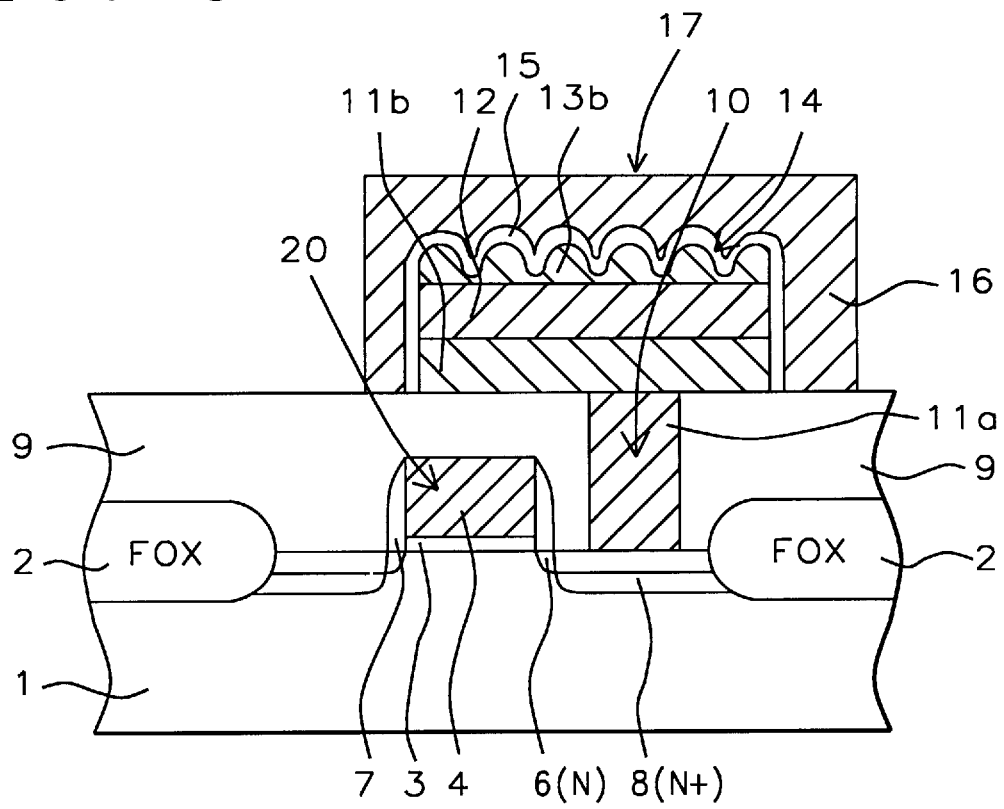

Conventional photolithographic and RIE procedures, using $Cl_2$ as an etchant for HSG silicon layer 13b, for doped polysilicon layer 12, and for undoped polysilicon layer 11b, are used to create storage node electrode 14, schematically shown in FIG. 5. After removal of the photoresist shape, used to define storage node electrode 14, via plasma oxygen ashing and careful wet cleans, a capacitor dielectric layer 15, is formed on the top surface of storage node electrode 14, including formation of capacitor dielectric layer 15, on the top surface of HSG silicon layer 13b. Capacitor dielectric layer 15, shown schematically in FIG. 6, can be a composite dielectric layer of silicon oxynitride—silicon nitride—silicon oxide, (ONO), at an equivalent silicon oxide thickness of between about 50 to 80 Angstroms. This ONO layer is created by initially creating a native, silicon oxide layer, between about 10 to 20 Angstroms in thickness, on the HSG silicon layer 13b. A thin layer of silicon nitride is next deposited, using LPCVD procedures, to a thickness between about 40 to 80 Angstroms. An oxidation procedure, performed in an oxygen—steam ambient, is next used to convert the surface of the silicon nitride layer, to a silicon oxynitride layer, thus creating the ONO layer.

After creation of capacitor dielectric layer 15, another polysilicon layer is deposited, via LPCVD procedures, at a temperature between about 560° to 580° C., to a thickness between about 1000 to 3000 Angstroms. The polysilicon layer can be grown using in situ doping techniques, or grown intrinsically and doped via ion implantation procedures, using arsenic or phosphorous. Conventional photolithographic and RIE procedure, using $Cl_2$ as an etchant are used to create upper electrode, or cell plate 16, shown schematically in FIG. 6. Photoresist removal is once again performed, using plasma oxygen ashing and careful wet cleans, resulting in stacked capacitor structure 17, featuring increased capacitor surface area, and thus increased capacitance, resulting from the use of storage node electrode 14, comprised with a top surface of HSG silicon layer 13b, formed using the process described in this invention.

While this invention has been particularly shown and described with reference to the preferred embodiments thereof, it will be understood by those skilled in the art that various changes in form and details may be made without departing from the spirit and scope of the invention.

What is claimed is:

1. A method for creating a storage node electrode, for a dynamic random access memory, (DRAM), device, on a semiconductor substrate, comprising the steps of:

providing a transfer gate transistor, comprised of a gate structure, on a gate insulator layer, and with a source/drain region, located in a region of said semiconductor substrate, not covered by said gate structure;

forming a storage node contact hole, in an insulator layer, exposing a source region, of said source/drain region;

forming a polysilicon plug structure, in said storage node contact hole;

depositing a first polysilicon layer;

depositing a second polysilicon layer, on said first polysilicon layer;

depositing an amorphous silicon layer on said second polysilicon layer;

annealing of said amorphous silicon layer, converting said amorphous silicon layer to a hemispherical grain, (HSG), silicon layer; and patterning of said HSG silicon layer, of said second polysilicon layer, and of said first polysilicon layer, to form said storage node electrode.

2. The method of claim 1, wherein said storage node contact hole is formed in said insulator layer, via an anisotropic RIE procedure, using $CHF_3$ as an etchant, and with said storage node contact hole having a diameter between about 0.3 to 0.5 micrometer.

3. The method of claim 1, wherein said first polysilicon layer, is an undoped polysilicon layer, deposited using LPCVD procedures at a temperature between about 560° to 600° C., to a thickness between about 300 to 500 Angstroms.

4. The method of claim 1, wherein said second polysilicon layer, is a doped polysilicon layer, deposited using LPCVD procedures at temperature between about 560° to 600° C., to a thickness between about 300 to 500 Angstroms, and in situ doped during deposition via the addition of either arsine or phosphine, to a silane ambient.

5. The method of claim 1, wherein said amorphous silicon layer is deposited using LPCVD procedures, at a temperature between about 490° to 550° C., to a thickness between 600 to 1500 Angstroms.

6. The method of claim 1, wherein said anneal, of said amorphous silicon layer, is performed at a temperature between about 600° to 650° C., at a pressure between about 0.5 to 1.5 mtorr, for a time between about 25 to 35 minutes.

7. The method of claim 1, wherein said storage node electrode is formed via an anisotropic RIE procedure, using $Cl_2$ as an etchant for said HSG silicon layer, for said second polysilicon layer, and for said first polysilicon layer.

8. A method for fabricating a stacked capacitor structure, for a DRAM device, on a semiconductor substrate, wherein the surface area of the stacked capacitor structure is increased via the use of an HSG silicon layer, functioning as the top layer of a storage node electrode, comprising the steps of:

providing a transfer gate transistor, comprised of a gate structure on a gate insulator layer, and with a source/drain region, in an area of said semiconductor substrate not covered by said gate structure;

depositing an insulator layer;

planarizing said insulator layer;

opening a storage node contact hole in said insulator layer, exposing the top surface of a source region, of said source/drain region;

forming a polysilicon plug structure in said storage node contact hole;

depositing an undoped polysilicon layer, in a low pressure chemical vapor deposition, (LPCVD), furnace;

using said LPCVD furnace, in situ depositing a doped polysilicon layer on said undoped polysilicon layer;

using said LPCVD furnace, depositing an amorphous silicon layer on said doped polysilicon layer;

using said LPCVD furnace, in situ annealing to convert said amorphous silicon layer to a hemispherical grain, (HSG), silicon layer;

patterning of said HSG silicon layer, of said doped polysilicon layer, and of said undoped polysilicon layer, to create said storage node electrode;

forming a capacitor dielectric layer on said storage node electrode; and forming a polysilicon upper electrode, for said stacked capacitor structure, overlying said capacitor dielectric layer, and overlying said storage node structure.

9. The method of claim 8, wherein said insulator layer is silicon oxide, deposited via LPCVD or PECVD procedures, to a thickness between about 6000 to 10000 Angstroms.

10. The method of claim 8, wherein said storage node contact hole is formed in said insulator layer, via an anisotropic RIE procedure, using $CHF_3$ as an etchant.

11. The method of claim 8, wherein the diameter of said storage node contact hole is between about 0.3 to 0.5 micrometer.

12. The method of claim 8, wherein said undoped polysilicon layer is deposited using LPCVD procedures, in said LPCVD furnace, at a temperature between about 560° to 600° C., to a thickness between about 300 to 500 Angstroms.

13. The method of claim 8, wherein said doped polysilicon layer is deposited using LPCVD procedures, in said LPCVD furnace, at a temperature between about 560° to 600° C., to a thickness between about 300 to 500 Angstroms, and doped in situ, during deposition, via the addition of arsine, or phosphine, to a silane ambient.

14. The method of claim 8, wherein said amorphous silicon layer is deposited using LPCVD procedures, in said LPCVD furnace, at a temperature between about 490° to 550° C., at a pressure to a thickness between about 600 to 1500 Angstroms.

15. The method of claim 8, wherein in situ anneal of said amorphous silicon layer, is performed in said LPCVD furnace at a temperature between about 600° to 650° C., and at a pressure between about 0.5 to 1.5 mtorr, for a time between about 25 to 35 minutes.

16. The method of claim 8, wherein said capacitor dielectric layer is comprised of silicon oxynitride—silicon nitride—silicon oxide, obtained via: the growth of a native oxide on the top surface of said HSG polysilicon layer, at a thickness between about 10 to 20 Angstroms; LPCVD deposition of a silicon nitride layer, to a thickness between about 40 to 80 Angstroms; and an oxidation to convert the top portion of said silicon nitride layer, to a silicon oxynitride layer.

17. The method of claim 8, wherein said storage node electrode is formed via an anisotropic RIE procedure, using $Cl_2$ as an etchant for said HSG silicon layer, for said doped polysilicon layer, and for said undoped polysilicon layer.

18. The method of claim 8, wherein said polysilicon upper electrode is comprised of a polysilicon layer, deposited using LPCVD procedures, to a thickness between about 1000 to 3000 Angstroms, and in situ doped, during deposition, via the addition of arsine, or phosphine, to a silane ambient, or the polysilicon layer is deposited intrinsically, and doped via ion implantation of either arsenic or phosphorus.

\* \* \* \* \*